(12) United States Patent
Ganesan et al.

(10) Patent No.: US 7,548,842 B2
(45) Date of Patent: Jun. 16, 2009

(54) SCALABLE SYSTEM FOR SIMULATION AND EMULATION OF ELECTRONIC CIRCUITS USING ASYMMETRICAL EVALUATION AND CANVASSING INSTRUCTION PROCESSORS

(75) Inventors: Subbu Ganesan, Saratoga, CA (US); Leonid Alexander Broukhis, Fremont, CA (US); Ramesh Narayanaswamy, Palo Alto, CA (US); Ian Michael Nixon, Sunnyvale, CA (US); Thomas Hanni Spencer, Sunnyvale, CA (US)

(73) Assignee: Eve S.A., Parc Gutenberg, Palaiseau (FR)

( * ) Notice: Subject to any disclaimer, the term of this patent is extended or adjusted under 35 U.S.C. 154(b) by 521 days.

(21) Appl. No.: 11/307,198

(22) Filed: Jan. 26, 2006

(65) Prior Publication Data

US 2006/0277019 A1   Dec. 7, 2006

Related U.S. Application Data

(63) Continuation-in-part of application No. 11/307,130, filed on Jan. 25, 2006, now Pat. No. 7,509,602.

(51) Int. Cl.
*G06F 17/50* (2006.01)
(52) U.S. Cl. .............................. 703/14; 703/13; 703/23; 714/30; 717/134; 370/258

(58) Field of Classification Search ................ 703/14, 703/13, 23; 714/30; 370/258; 716/14; 712/14; 710/101, 268; 717/134
See application file for complete search history.

(56) References Cited

U.S. PATENT DOCUMENTS

| | | | |
|---|---|---|---|
| 5,418,952 A * | 5/1995 | Morley et al. ................ 712/14 |
| 6,152,612 A * | 11/2000 | Liao et al. ..................... 703/23 |
| 6,292,929 B2 * | 9/2001 | Scepanovic et al. ........... 716/14 |
| 6,389,498 B1 * | 5/2002 | Edwards et al. ............. 710/268 |
| 7,103,008 B2 * | 9/2006 | Greenblat et al. ........... 370/258 |
| 2001/0014925 A1 * | 8/2001 | Kumata ...................... 710/101 |
| 2002/0162094 A1 * | 10/2002 | Barret et al. ................. 717/134 |
| 2004/0221201 A1 * | 11/2004 | Seroff ......................... 714/30 |
| 2005/0234692 A1 * | 10/2005 | Reblewski ................... 703/13 |
| 2006/0074622 A1 * | 4/2006 | Scott et al. ................... 703/23 |

* cited by examiner

Primary Examiner—Paul L Rodriguez
Assistant Examiner—Kandasamy Thangavelu
(74) Attorney, Agent, or Firm—Patentry

(57) ABSTRACT

A scalable system for verifying electronic circuit designs in anticipation of fabrication by compiling a hardware description to instructions for canvassing processors and instructions for circuit evaluation processors which are scalably interconnected to provide simulation and emulation, having deterministically scheduled transfer of circuit signal values among the large number of circuit evaluation processors.

11 Claims, 14 Drawing Sheets

SCALABLE SYSTEM FOR SIMULATION AND EMULATION OF ELECTRONIC CIRCUITS USING ASYMMETRICAL EVALUATION AND CANVASSING INSTRUCTION PROCESSORS

CROSS-REFERENCE TO RELATED APPLICATIONS

The present application claims the benefit of priority under 35 USC .sctn. 119(e) from U.S. provisional patent application 60/595,057 filing date Jun. 2, 2005 first named inventor Ganesan, titled: "Massively parallel platform for accelerated verification of hardware and software."

The present application is a continuation in part of U.S. patent application Ser. No. 11/307,130 filing date Jan. 25, 2006, first named inventor Ganesan, titled: "A compact processor element for a scalable digital logic verification and emulation system".

BACKGROUND OF THE INVENTION

1. Field of the Invention

The present invention relates to the electronic design of integrated circuits, and more specifically to a method for the functional verification of a target integrated circuit design.

2. Related Art

Functional verification is one of the steps in the design of integrated circuits. Functional verification generally refers to determining whether a design representing an integrated circuit performs a function it is designed for. The inventors have previously disclosed functional verification systems (U.S. Pat. Nos. 6,691,287, 6,629,297, 6,629,296, 6,625,786, 6,480,988, 6,470,480, and 6,138,266) in which a target design is partitioned into many combinational logic blocks connected by sequential elements. The state tables corresponding to the logic blocks are evaluated and stored in multiple random access storage devices (RASDs). Such an approach may have several disadvantages. For example, some logic blocks may exceed the convenient width of typical RASDs. Some target designs may contain functional blocks such as user specific memories, or simply require many more logic blocks and internal signals than can be practically accommodated. Accordingly, the embodiments of previous patents may not be suitable in some environments.

Thus it can be appreciated that what is needed is a system to scale a hardware simulation system for electronic circuit design which limits the number of circuit signal values shared throughout the system, limits the size of the data storage and media required for circuit signal values, tolerates the occasional early or late arrival of data without faulting, allows additional hardware resources to be incrementally added easily, and limits the media requirement for a host interface. Accordingly, what is needed is a method of operating a scalable architecture for more evaluation processors than can be practically interconnected in a single chip, board, or backplane.

SUMMARY OF THE INVENTION

A system, disclosed in FIG. 1A, for verifying electronic circuit designs in anticipation of fabrication by simulation and emulation, comprising a first evaluation unit 110, a second evaluation unit 110, circuit means 120 to transfer circuit value data from the first evaluation unit and receive and store circuit value data in the second evaluation unit, a host control interface, and a compiler. An evaluation unit 110 comprises a plurality of evaluation processors 111 and one or more canvassing processors 112.

In an embodiment the circuit means 120 to transfer circuit value data may be a network using high-speed serial links as a communications medium for deterministically scheduled packets sent by a transmission circuit in the first evaluation unit and received and stored in the second evaluation unit.

DETAILED DESCRIPTION

Figure 1A:
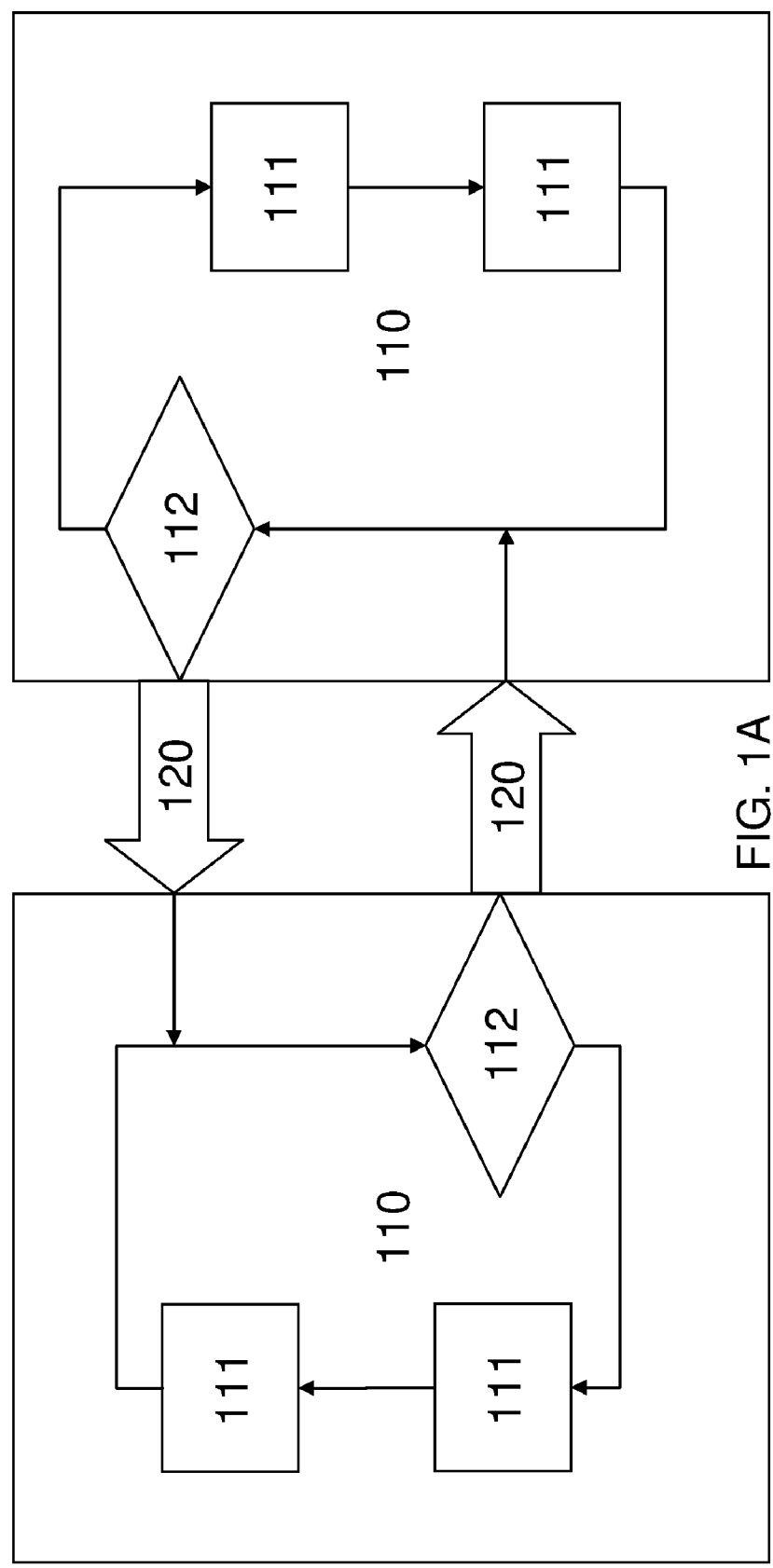
FIG. 1A is a block diagram of a system comprising two evaluation units.

The present invention is a system for verifying electronic circuit designs in anticipation of fabrication by simulation and emulation. The system uses a plurality of evaluation units each made up of
- a plurality of evaluation processors,
- a plurality of canvassing processors,
- one or more circuit signal value transfer circuits,
- one or more circuit signal value reading circuits with associated transfer storage device
- one or more circuit signal value storage units
- one or more instruction storage units, and
- busses, wires, transmission lines, or networking for transferring instructions and circuit signal values among processors, and storage units;
- a second evaluation unit;
- busses, wires, cables, transmission lines to transfer deterministically scheduled circuit signal values sent by a transfer circuit in the first evaluation unit and read and stored in the second evaluation unit; and
- a software product compiler, tangibly encoded on a computer readable storage device as instructions controlling a computer system to perform the following method: analyzing a circuit description for inherent circuit value data transfer activity among its elements, translating the circuit description to evaluation processor instructions, assigning the evaluation processor instructions to certain storage devices associated with certain evaluation processors to optimize circuit value data transfer, generating canvassing processor instructions to ensure that results from certain evaluation processors are transferred to certain other evaluation processors according to the circuit description, scheduling the execution of evaluation processor instructions and canvassing processor instructions to avoid deadlock, and transferring certain evaluation results to the host computer interface.

The evaluation processor further has data checking circuits so that execution of an evaluation processor instruction is blocked until all of the data required for the instruction is available. In an embodiment the evaluation processor is a custom application specific circuit having logic instructions corresponding to multivalue logic evaluation of three or more input logic functions. (e.g. X=xor(Z, 0, 1, X) In an alternate embodiment of the invention the evaluation processor is a commercial processor with embedded microinstructions to evaluate a sequence of two input logic functions upon inputs with three or more logic values thereby emulating a circuit having logic instructions for multivalue logic evaluation of three or more input logic functions.

The canvassing processor has transferring circuits coupled to reading circuits for avoiding overflow of the reading circuits wherein transfer is suspended until the reading circuit has available transfer storage capacity.

The system further has a host control interface coupled to a host and to a trace control unit.

The present invention further comprises a method for scalably emulating the electronic circuit description, tangibly embodied as program instructions on a computer-readable medium controlling the operation of one or more processors, the method comprising the steps of executing program instructions on a plurality of evaluation processors and on a plurality of canvassing processors resulting in the transfer of results of selected evaluation processor evaluations available to and read by selected evaluation processors to perform further evaluations; and updating one or more circuit signal values, wherein updating in an embodiment comprises the steps of reading a circuit signal value, transferring a circuit signal value, and storing a circuit signal value data in circuit signal value storage media;

suspending the execution of evaluation instructions until data is available, wherein suspending comprises the steps of checking signal value transfer storage for availability of all the data necessary for executing an evaluation instruction and enabling the execution of the evaluation instruction only when the data necessary for executing the evaluation instruction is available, and controlling the transfer of signal values, wherein controlling comprises the steps of composing canvassing instructions to pass the results of a selected evaluation processor to those evaluation processors which require those results to execute their evaluation instructions; and blocking the execution of canvassing instructions, wherein blocking comprises the steps of checking the reading circuit data value transfer storage for unoccupied storage resource and enabling the execution of the canvassing instruction only when the reading circuit has unoccupied transfer storage resource;

compiling one or more hardware descriptions to processor instructions, wherein compiling comprises translating the electronic circuit description into executable evaluation instructions, and analyzing the circuit value transfers inherent to the electronic circuit description;

scheduling the execution of evaluation instructions in a plurality of processors, wherein scheduling comprises assigning evaluation instructions among evaluation processors to optimize circuit value transfers inherent in the electronic circuit design; and loading the evaluation instruction storage so that a first evaluation instruction is executed after one or more second evaluation instructions on which the first evaluation instruction depends for signal value data input wherein first and second refer not to the process of execution but rather to the process of scheduling which is in reverse from outputs to inputs of the target circuit under simulation. It will be appreciated by those skilled in the art that the order of steps disclosed above may be changed or performed in parallel and the nature of the invention does not substantially depend on the sequence of steps disclosed for easier understanding of the present invention in an embodiment.

Figure 1B:
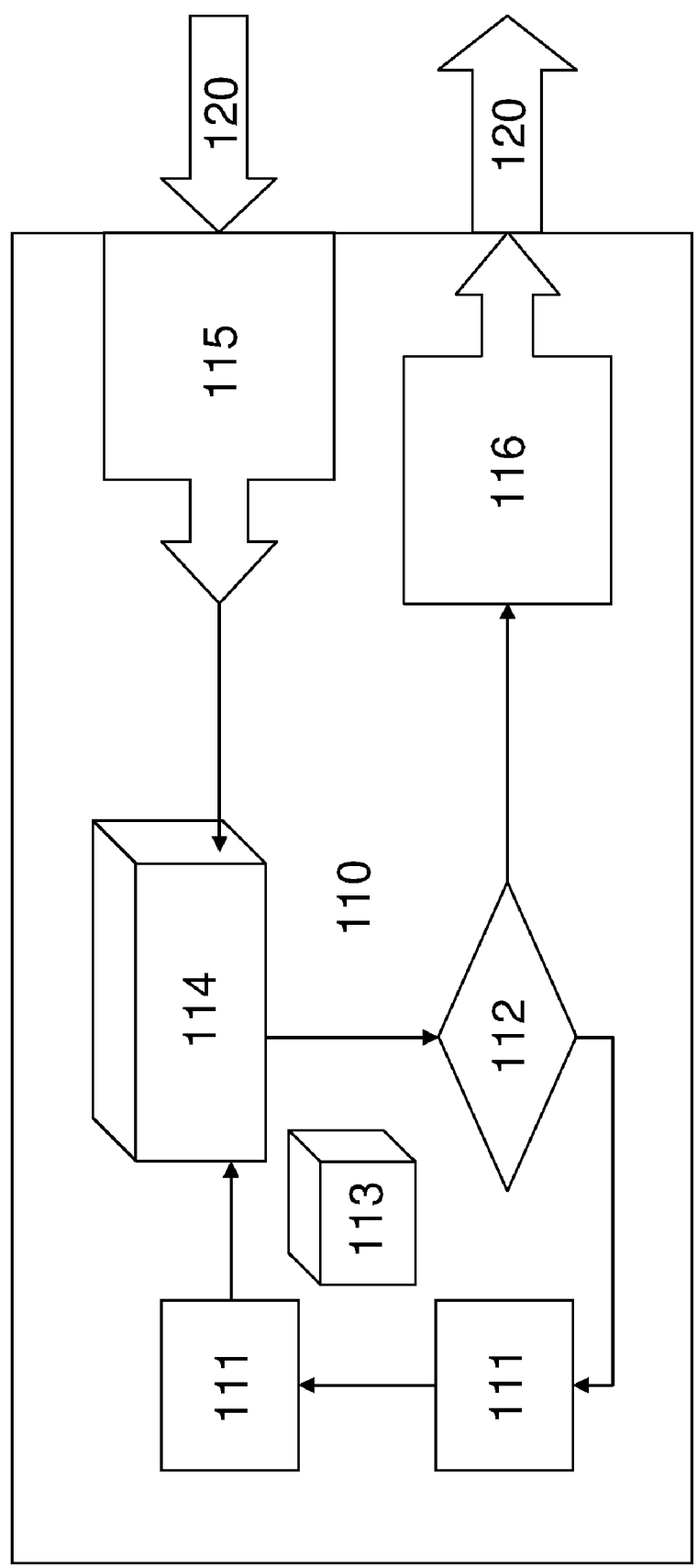
FIG. 1B is a block diagram with further detail of an evaluation unit.

The present invention further disclosed in FIG. 1B is a system for verifying electronic circuit designs in anticipation of fabrication by simulation and emulation, comprising a first evaluation unit 110, the evaluation unit comprising: a host control interface, a plurality of evaluation processors 111, a plurality of canvassing processors 112, one or more circuit value data transfer circuits 116, one or more reading circuits 115 with associated transfer storage device, a circuit signal value storage unit 114, and instruction storage units 113.

The means for transferring an instruction or a circuit signal value among one or more processors, and one or more storage devices, include but are not limited to wire, printed trace, bus, fiberoptic cable, transmission line, or high-speed serial links.

Each evaluation processor is coupled to a plurality of other evaluation processors and through a canvassing processor to a medium coupled to all other evaluation processors in the system. The evaluation processor is further coupled to an instruction storage device and to a circuit value storage device. The evaluation processor is blocked from executing the instruction until all the necessary circuit values it requires as inputs are validated by a data checking circuit.

Each canvassing processor is coupled to the outputs of a plurality of evaluation processors and is coupled to certain transfer circuits of the medium. Under the control of a canvassing instruction scheduled by the compiler, it deterministically transfers a certain evaluated circuit signal value to a certain reading circuit coupled to a certain evaluation processor requiring the circuit signal value for further evaluation.

The present invention further comprises a scheduling method wherein the transfer of evaluation results are coordinated to eliminate the possibility of deadlock, a critical path reduction method wherein logic which is dependent on the results of earlier logic evaluation is grouped to optimize efficiency, a unit assigner method, and an octal meta function evaluation method, wherein operations may be performed across wider input functions.

Scheduler

The present invention further comprises a method of coordinating the evaluation of logic and transfer of logic evaluation results on a bus to eliminate the possibility of deadlock wherein results cannot reach the logic which requires input data.

The present invention further comprises a method for managing unit to unit data transfer. This takes several cycles so transfer must be scheduled within a window ahead of when data is needed in a target unit. And only so many transfers can be handled "in transit" so some logic may be held for evaluation until bandwidth is available. The method is not strictly synchronous thereby tolerating some flexibility in promptness.

Initially every transfer is assumed at its worse case of being unit to unit. By assigning an edge to intra-unit transfer it simplifies the scheduling of the bus resource and reduces the time spent in transit. An edge on the critical path is randomly chosen to be placed within a unit. If the critical path is still critical repeat, else calculate another critical path. Stop when all of the physical resources for clusters in a unit are consumed. In conventional systems there is effectively one unit and no concept of optimizing assignment across units.

The present invention further comprises a method for bus management to avoid deadlock. A window of several cycles is required to propagate evaluation output data to the subscribing evaluation inputs. So scheduling of a data receive to drive a specific cluster, means a data transmit must be done with some error margin before that and the logic evaluation that drives the bus must occur in a cluster in an advanced time.

It is not the case that transfer can occur in any order. Suppose that nodes A and B are on unit X and need to send data to unit Y. It is not necessarily the case that the data from nodes A and B can be sent from X to Y in the same cluster. For example, maybe A drives B, so A needs to be evaluated before B. If we were scheduling forward in time, this would not be an issue. However, the compiler schedules backward in time, so it needs to group signals that are to be received together before it determines exactly when they will be sent. Therefore, to prevent deadlock, the unit assigner method comprises the step of grouping signals to be communicated into packets and encoding constraints in the netlist on the order in which packets are sent to make sure that transmission ordering constraint imposed by the order in which signals are received does not conflict with other constraints on computing the order in which signals transmit.

If two units were to send too much data to each other without receiving anything, execution of both units would block and deadlock would occur. To prevent this, the compiler method comprises the steps of tracking the amount of communication in progress from each unit to each other unit. If this amount might be bigger than the transmission FIFO, the compiler method further comprises the step of avoiding scheduling receives until transmits have been scheduled. If necessary, the compiler method further comprises modifying the netlist to allow a transmission to be scheduled immediately.

The present invention comprises an evaluation unit which may be scalably interconnected to one or more other evaluation units by direct backplane connection or by optical cables and to a host interface. Two evaluation units connected by backplane comprise an evaluation module. A plurality of evaluation modules may be scalably interconnected because the compiler optimizes communication and switches circuit value data in what effectively is a deterministically scheduled packet transmission network.

The compiler further embodies a method of modeling a clock in the user's design that can be compiled to hardware accelerator machine instructions wherein the hardware accelerator may self clock and not be slaved to a clock signal generated from a host resident software simulator, the method consisting of the following steps:

maintaining the current time T in ticks as a register vector, initialized to 0, maintaining the clock generation enabling signal E, initialized to 1, maintaining a set of time variables R—one per clock—holding the time remaining until the next event on each clock as register vectors no wider than the number of bits required to hold the max phase duration of the corresponding clock, initializing the variables R to the initial duration of the corresponding clock, computing the minimum (M) of the values of these variables and in an embodiment using a balanced tree of less-than comparators for efficiency, incrementing T by M, decrementing R variables by M, wherein for those clocks corresponding to R variables that are equal to 0, updating the value of the clock signal either to the inverse of the current value, or to the first phase value if the current value is X AND assigning the phase duration corresponding to the new value of the clocks (pos or neg) to the corresponding R variables, maintaining an oscillating clock C where the oscillation is triggered by E (assign C=C^ E), thereby allowing the user code to stop the simulation by assigning 0 to E, and instructing the compiler and the sequence processor to treat C as a special clock to signify that the oscillation of that clock is expected while still allowing to detect possible oscillations of the derived clocks in the design under test, and finally, sending the updated value of T to the host simulator: for the $display($time, . . . ) calls and $dumpvars to work correctly and injecting a time advance mark to the signal trace stream.

In an embodiment of the present invention, a list of clock waveform descriptions in the form (initial value (may be X), initial duration, first phase value, pos phase duration, neg phase duration)

are mapped from a Verilog, C, or VHDL compatible syntax to hardware instruction code that maintains the notion of current time and manipulates the clock signals according to the descriptions.

An embodiment of the present invention is described as follows: A reconfigurable simulation acceleration verification center comprises a plurality of simulation acceleration appliances in a single chassis and optionally attaching to other appliances of other chassis. A method of reconfiguring the interconnect converts a plurality of simulation acceleration appliances into a single larger system.

Figure 2:
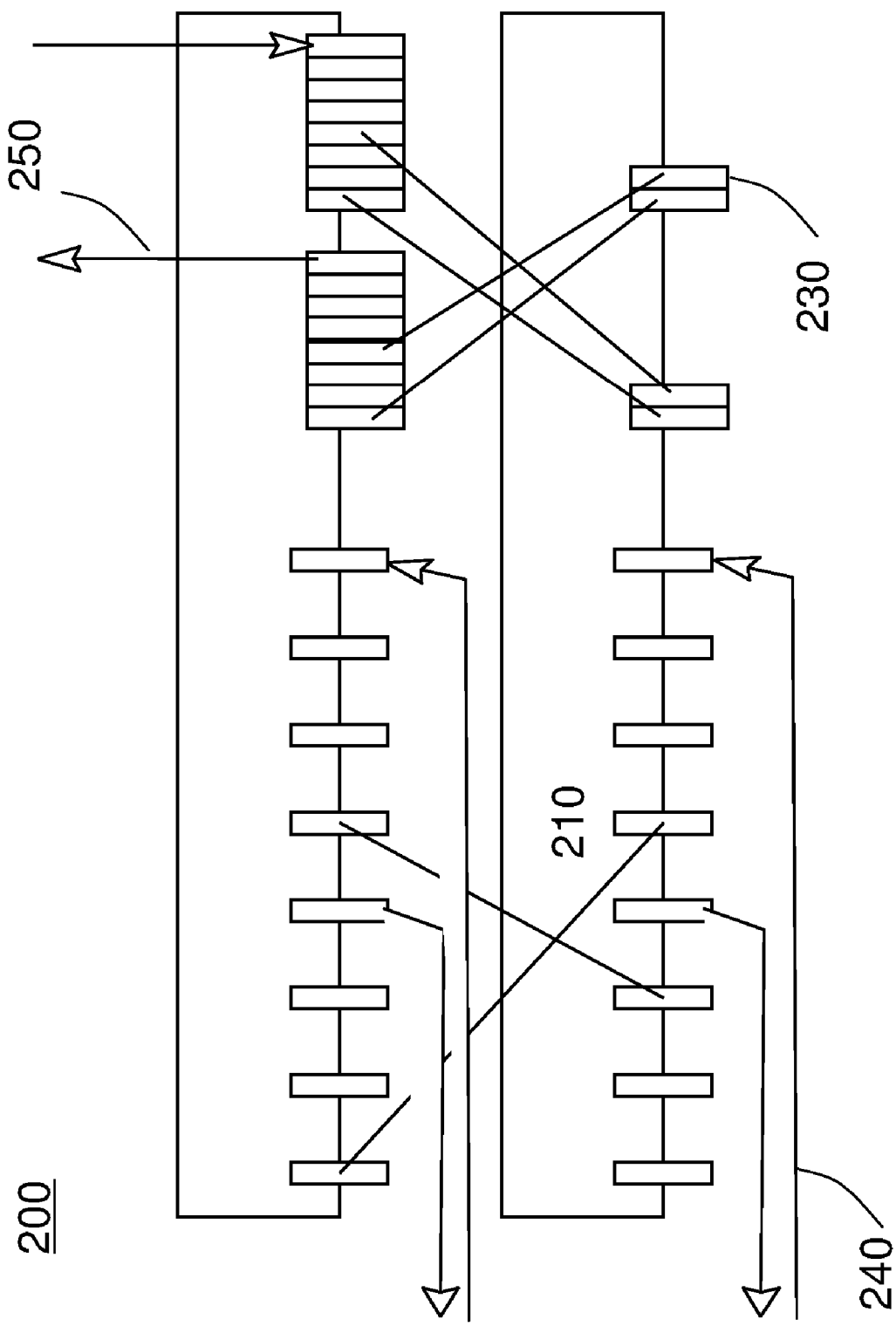
FIG. 2 is a schematic of the interconnect of a system.

A single-user simulation acceleration verification center comprising a fiber-based interconnection topology 200 is shown in FIG. 2 attached to a plurality of evaluation module units in a chassis and optionally attaching to other evaluation module units of other chassis not shown through high speed serial links 240.

For each of the evaluation module units there may be a plurality of evaluation transmitters and receivers 210 allowing each evaluation module unit to communicate with every other evaluation module unit within its chassis as well as to an evaluation module unit in another chassis. An evaluation module unit may also have a plurality of host transmitters and host receivers 230 and connect to the first evaluation module unit in a chassis and thence to the host through high speed serial links 250.

In an embodiment each evaluation module unit may be attached by a plurality of evaluation transmitter physical links, a plurality of evaluation receiver physical links, a plurality of local evaluation receiver links, a plurality of host transmitter physical links and a plurality of host receiver physical links.

Figure 3:
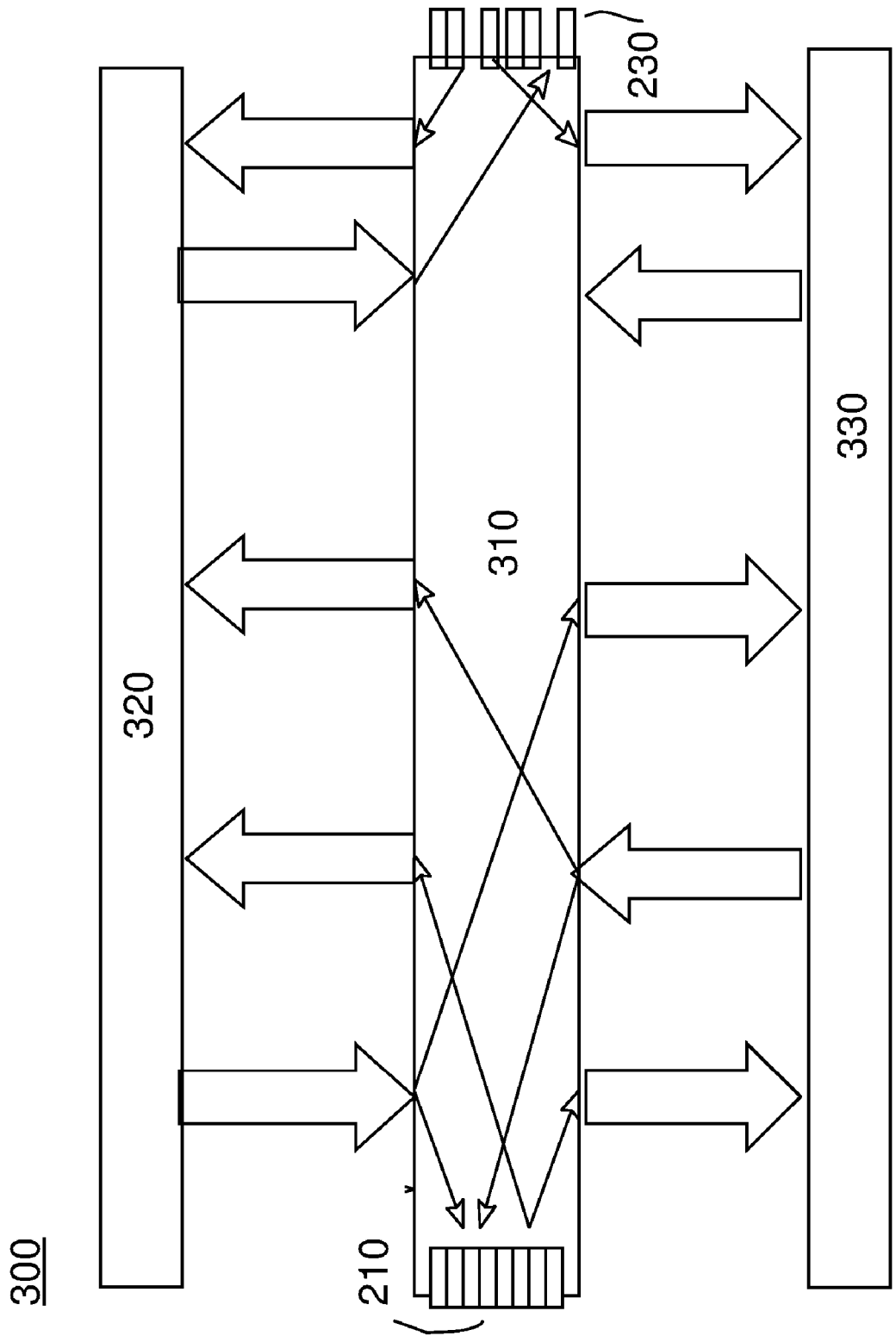
FIG. 3 is a schematic of the backplane interconnect of a module.

A simulation acceleration appliance 300 is shown in FIG. 3 comprising an interconnect 310 attached by high speed serial links 210 to an evaluation module unit 320 and a second evaluation module unit 330. The high speed serial links may consist of 4 types: evaluation receivers, evaluation transmitters 210 which exchange signal data between the evaluation module units, and host transmitters, and host receivers 230 which may exchange information with an attached workstation.

Evaluation Unit—An embodiment of the present invention further comprises a control processor, a plurality of octal combinational logic operation evaluators, a trace unit and a data unit attached to the interconnect network.

Figure 4:
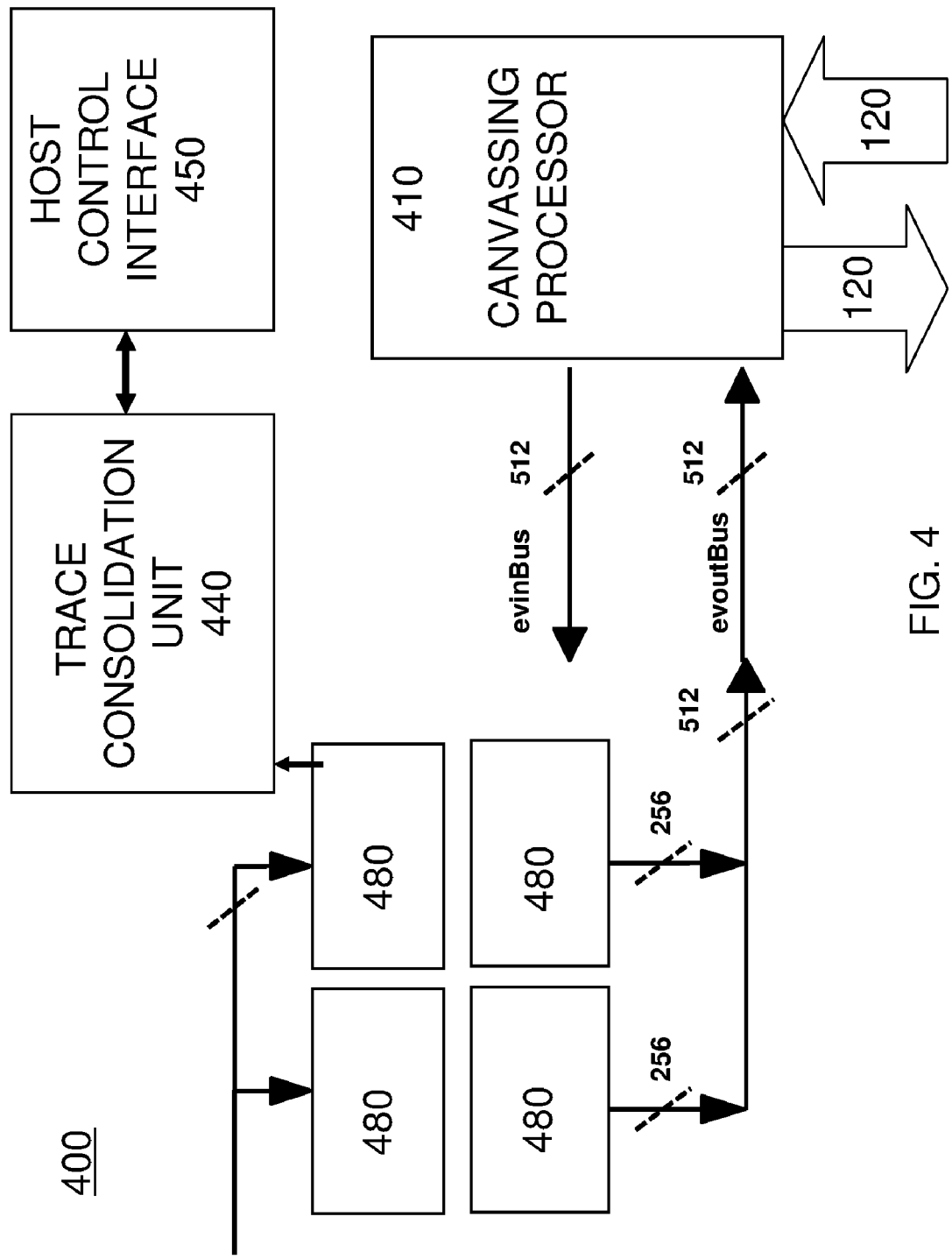
FIG. 4 is a block diagram of an evaluation module unit.

An evaluation module unit 400 shown in FIG. 4 comprising a canvassing processor 410 attached by a 512 bit bus to a plurality of micro octal simulation accelerator integrated circuits 480 attached to a trace consolidation unit 440, the evaluation module unit further comprising a host bus control 450.

Figure 5A:
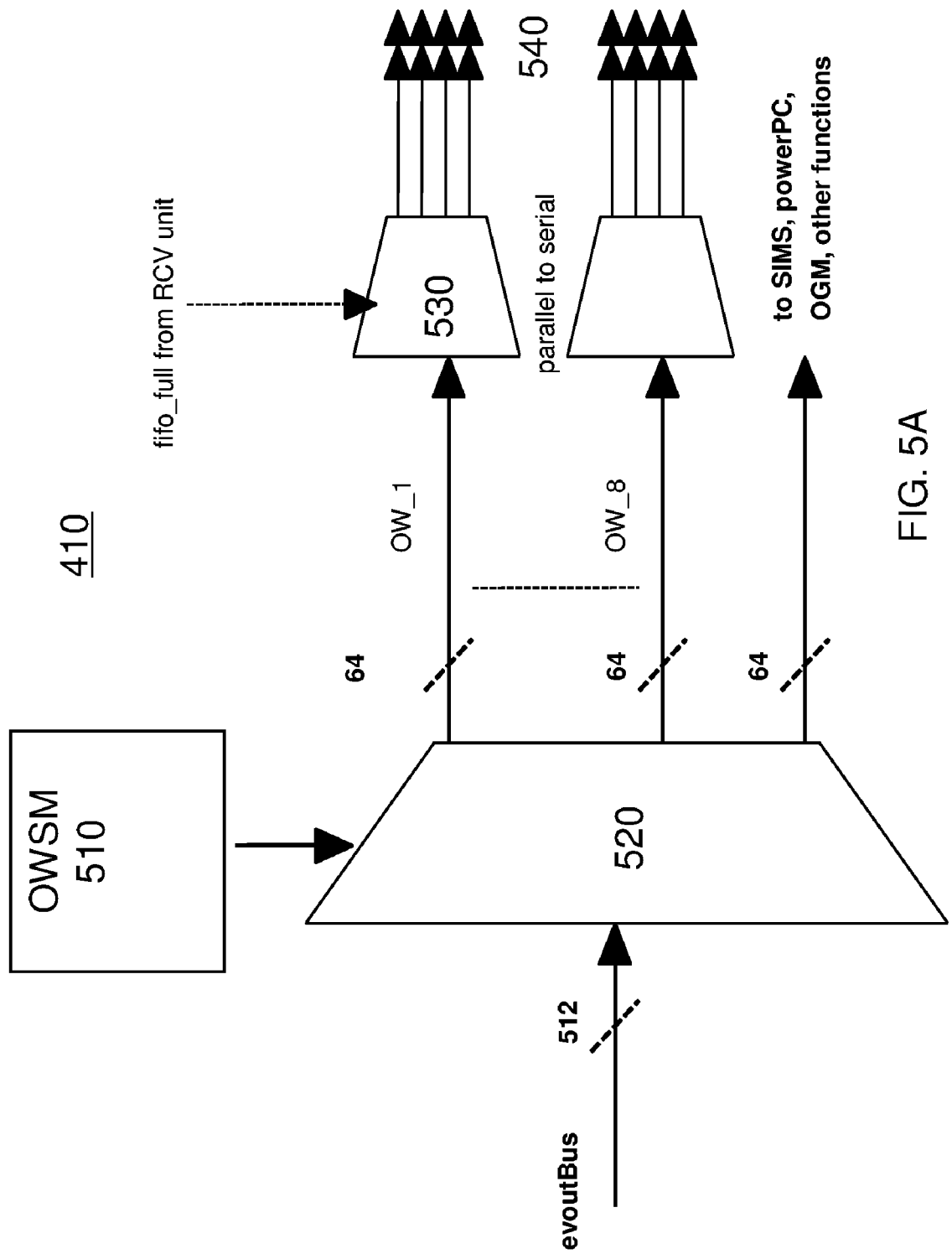
FIG. 5A is a block diagram of the transfer circuit of a canvassing processor.
Figure 5B:
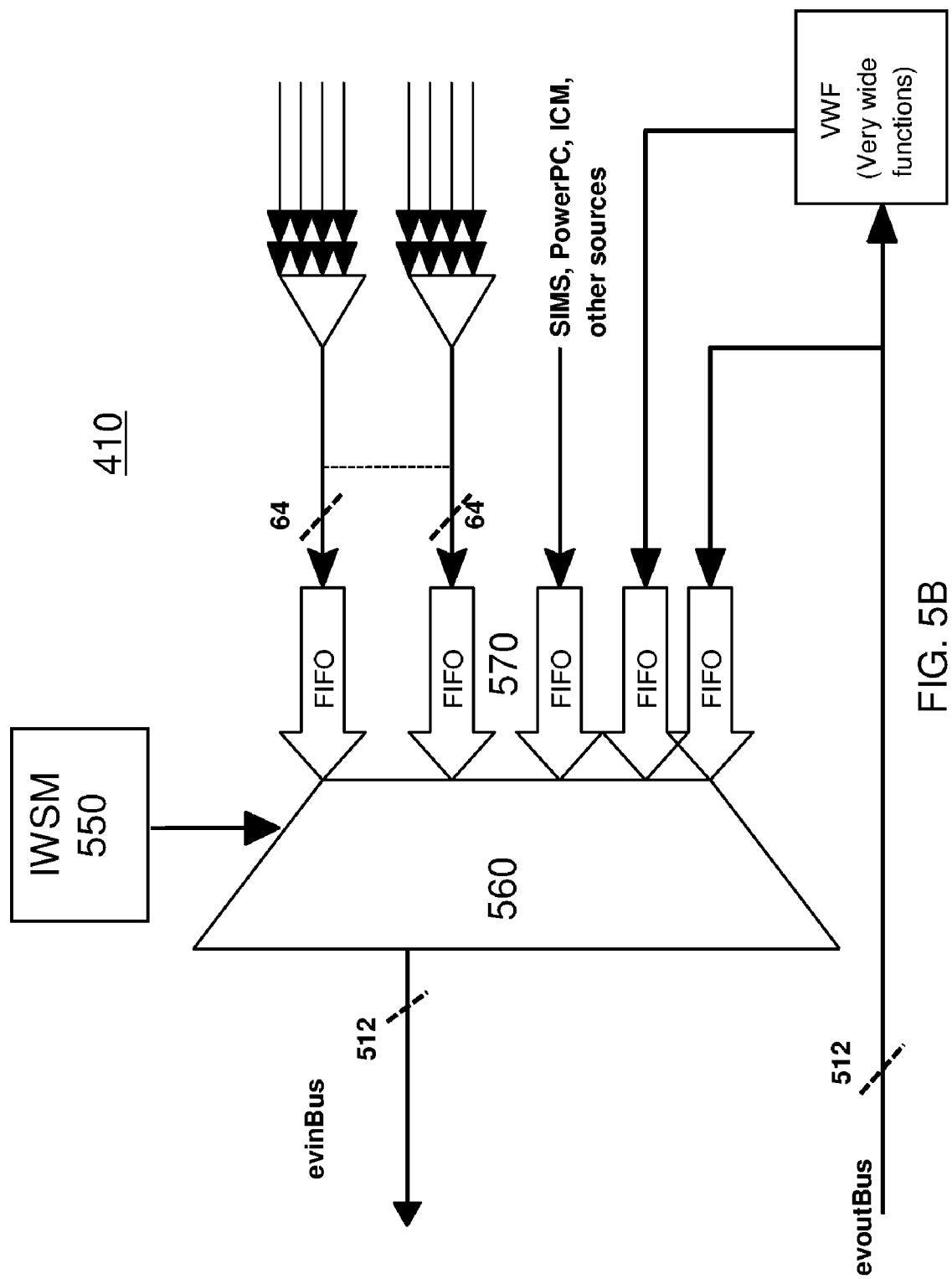
FIG. 5B is a block diagram of the read circuit of a canvassing processor.

A canvassing processor 410 is shown in further detail in FIGS. 5A and 5B comprising an output word select memory 510 controlling an output word select multiplexor 520 in an embodiment selecting 64 bits of the 512 bit bus, attached to a plurality, in an embodiment eight, parallel to serial converters 530 each attached to high speed serial transmitters 540, and an input word select memory 550 controlling an input word select multiplexor 560 attached to a plurality of fifo memories 570 attached variously to the evoutbus 571, a very wide function module 572, control signals 573, and a plurality, in an embodiment to eight, high speed serial link receivers 580, said input word select multiplexor 560 also driving the evinbus 562.

In an embodiment of the present invention, high speed serial links in the canvassing processor 410 are a means for transmitting between two units whereby scaling of simulation hardware accelerators as chip designs exceed the capacities of monolithic accelerator architectures is achieved beyond conventional limits.

An embodiment of the present invention comprises an apparatus for emulation and simulation of large electronic circuit designs, the apparatus presents a plurality of canvassing processors coupled to one or more high-speed serial links, the links coupled to certain evaluation processors wherein said evaluation processors may be coupled to other evaluation processors directly but some evaluation processors are scalably coupled only by means of the canvassing processor attached high-speed serial link.

A first evaluation unit control processor executes an instruction stream which includes an instruction to evaluate the transmission communication cluster by the method comprising the following steps: instructing the evaluation module plane comprising a plurality of evaluation processor to evaluate the cluster, sending the output data for this cluster to the canvassing processor, determining through a cluster instruction lookup table what to do with input data and which part of the data for this cluster is to be sent to another evaluation unit, and queuing that data to the serial link for transmission to a second evaluation unit.

The control processor in a second unit executes an instruction stream which includes an instruction to handle the receiver communication cluster, using a look up table which determines that the cluster is a receiver cluster from the first unit causing the control processor to check for data, wait for it, and then instructing the evaluation unit to evaluate the cluster, the control unit then popping the receiver data out of its fifo memory and transmitting it to the appropriate evaluation unit.

Octal Combinational Logic Operation Evaluator

An embodiment of the present invention further comprises a plurality of integrated random access storage devices driven and read by a multiplexor selecting stored output values of previous evaluations, a trace unit, a control processor, and a wide function evaluator.

Figure 6A:
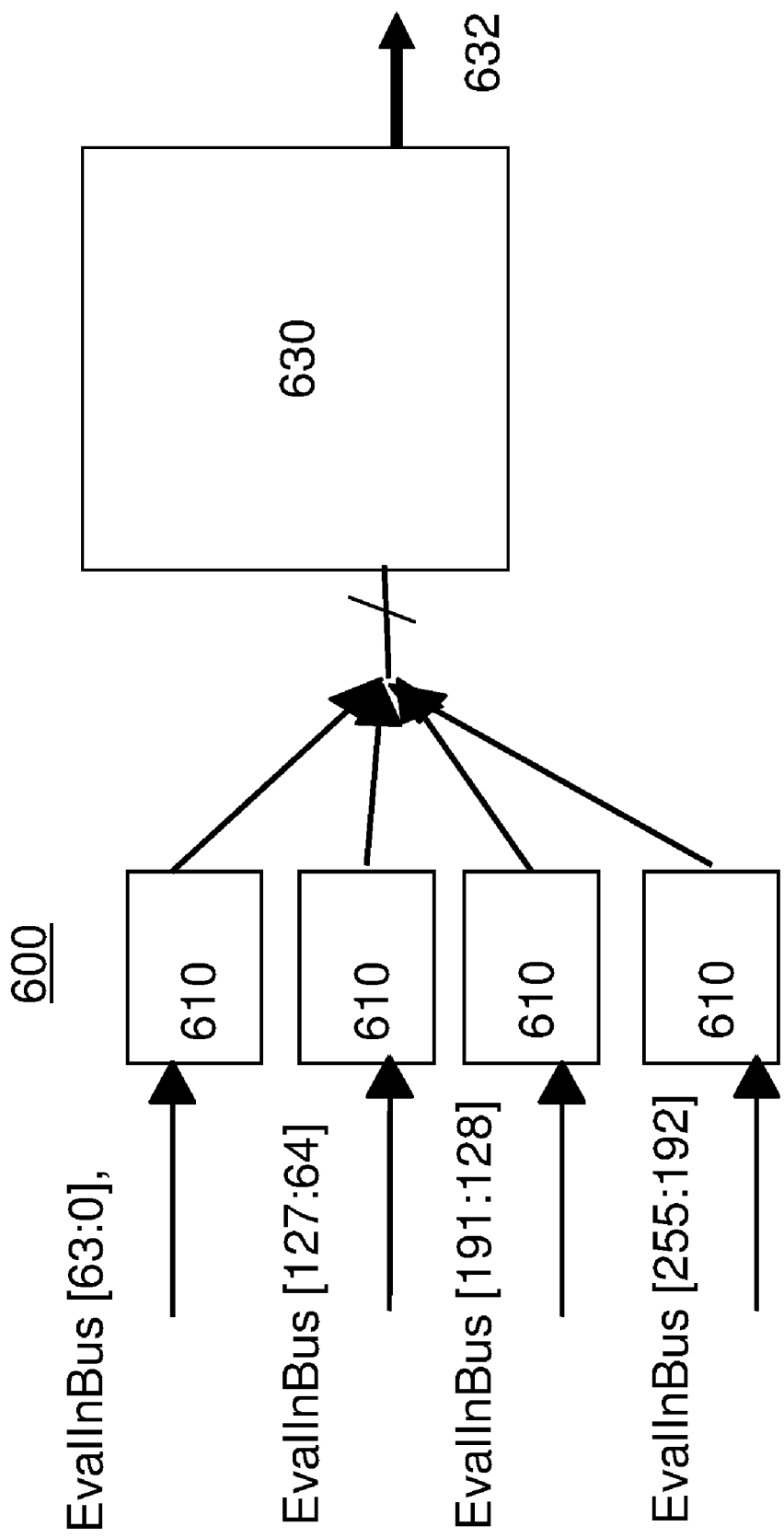
FIG. 6 is a block diagram of a data rate converter.
Figure 6B:
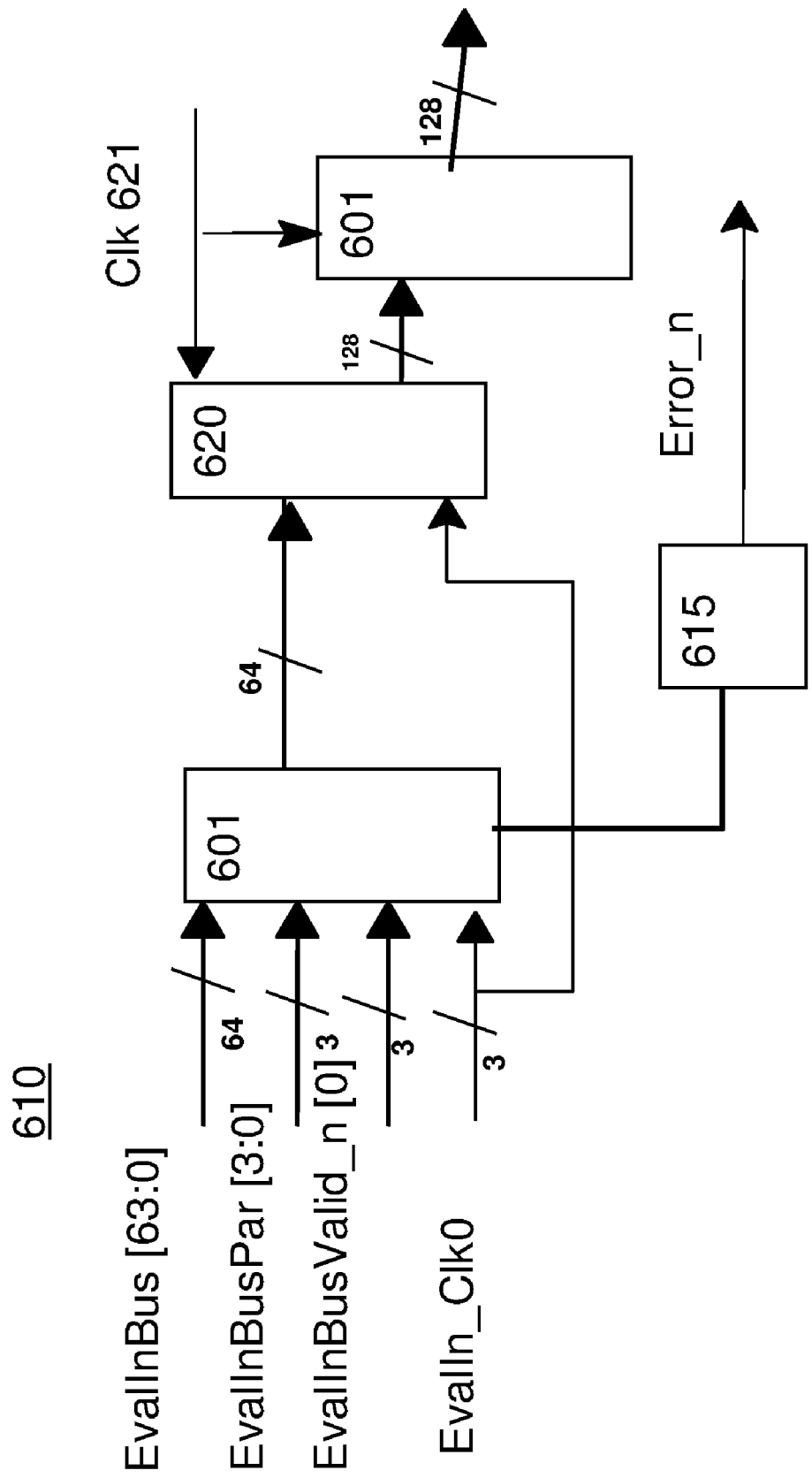
Figure 7A:
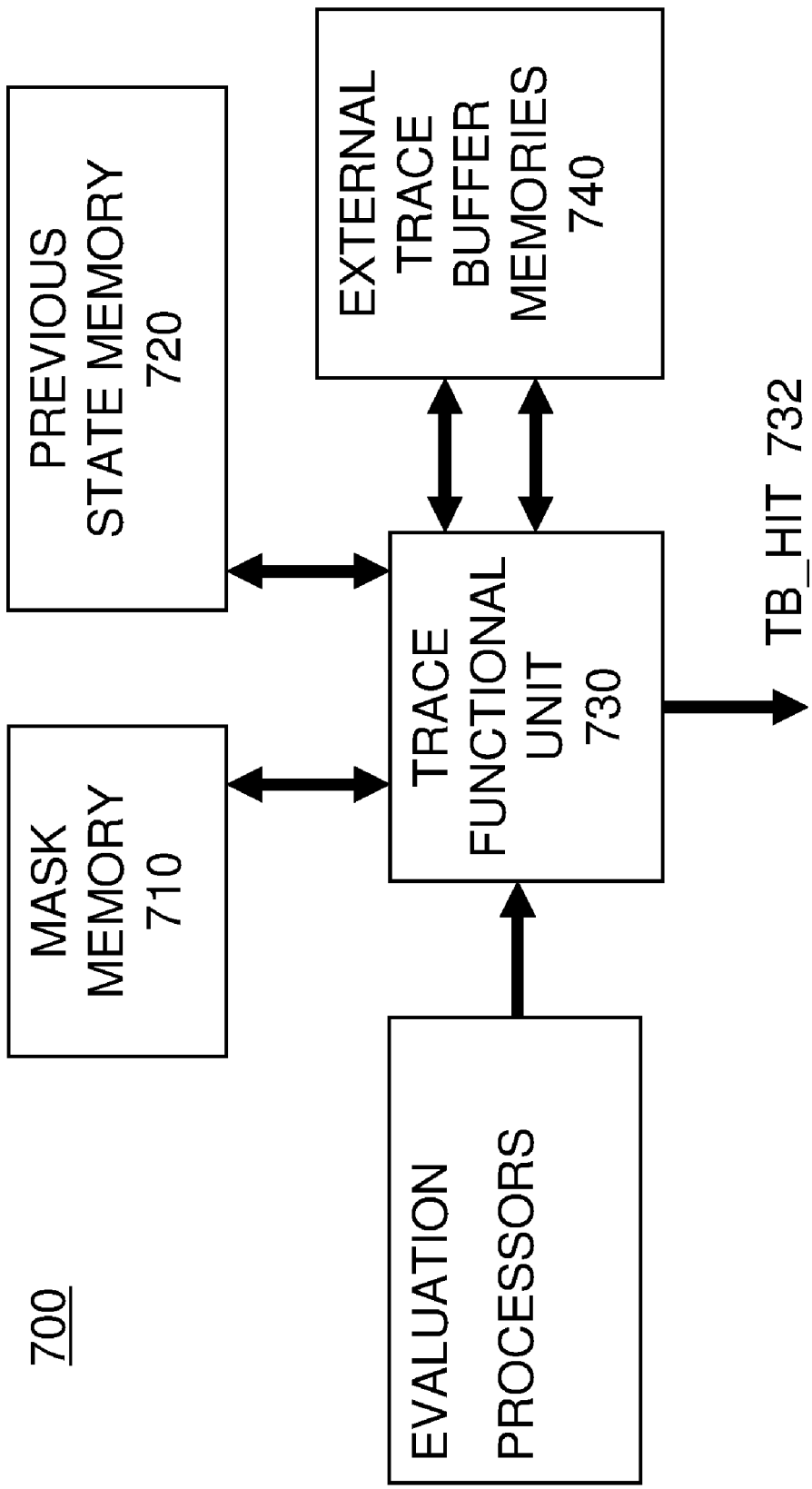
FIG. 7 is a block diagram of a trace system.
Figure 7B:
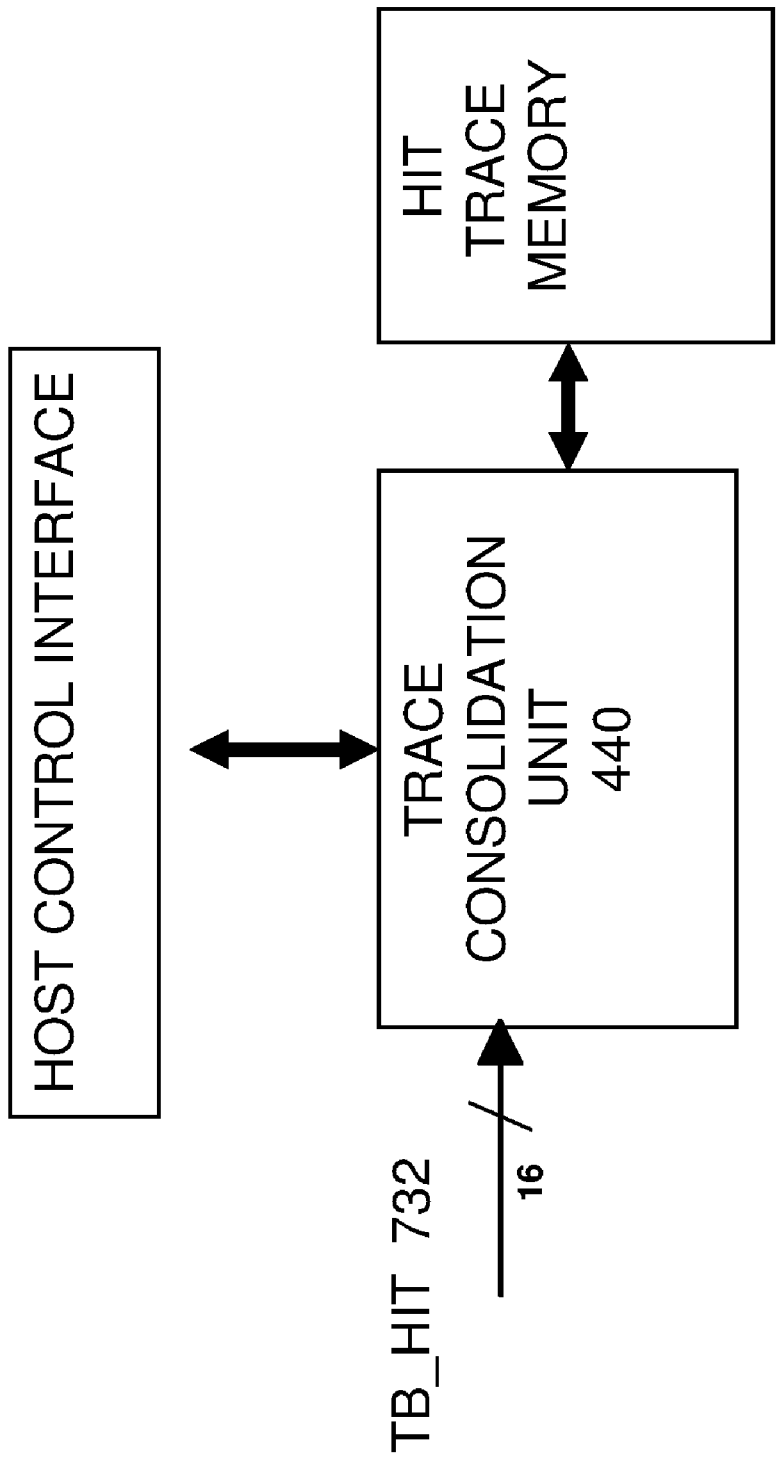
Figure 8:
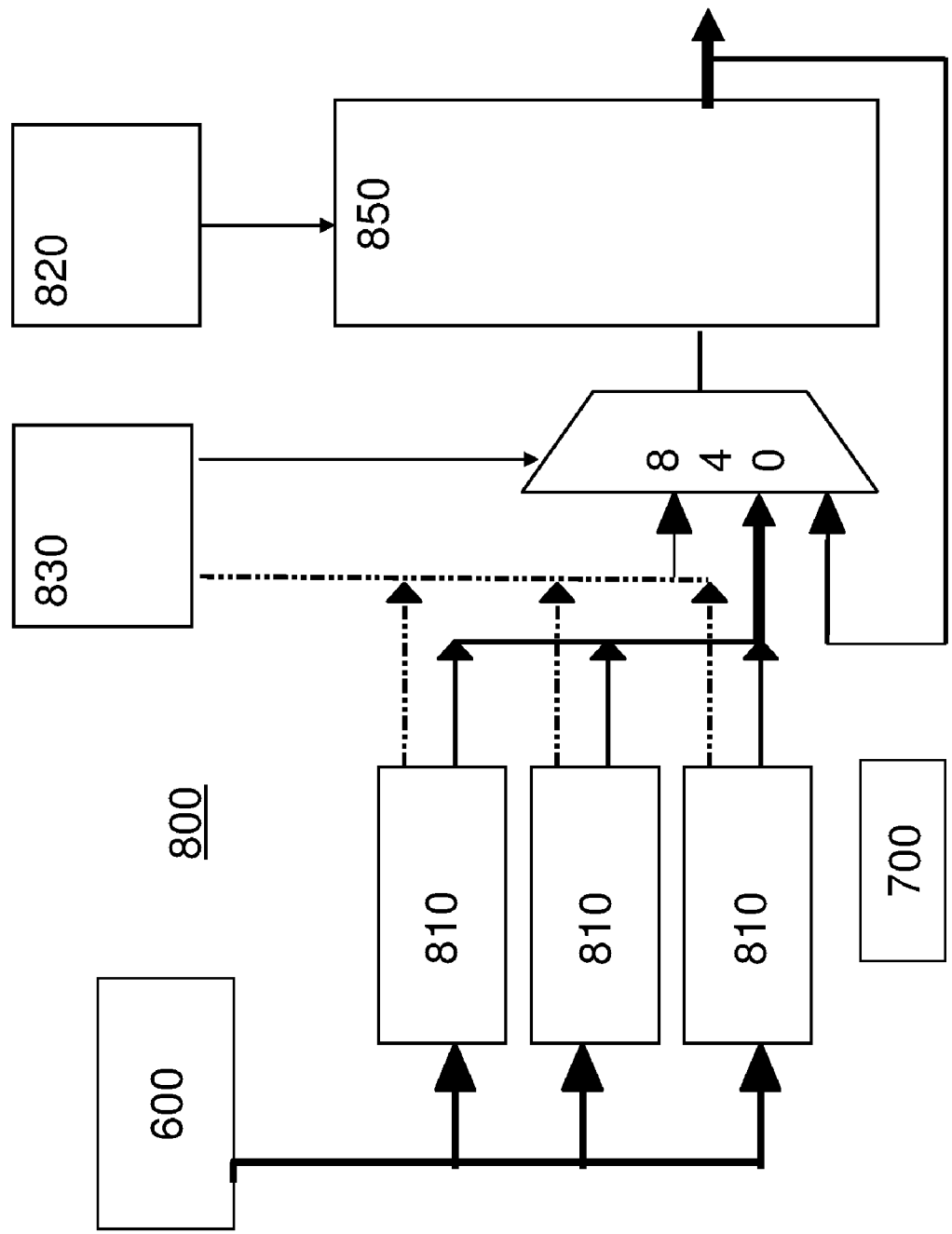
FIG. 8 is a block diagram of an octal ic containing eight evaluation processors

An embodiment of the present invention is a micro octal simulation accelerator integrated circuit which comprises a data rate converter 600 shown in FIG. 6, a trace filter unit 700 shown in FIG. 7, a plurality of combinational logic operation evaluation blocks 810, a programmable multiplex controller 820, a plurality of customer designed memories 830, a multiplexor 840, and an Octal Meta Function evaluator 850 shown in FIG. 8. In an embodiment, each micro octal simulation accelerator integrated circuit comprises means for reading and storing 512 bits of the evinbus, retrieving 32 bits of evoutbus and passing through 128 bits of signal memory output and through multiplexed selection and optional wide fixed function evaluation, distributing 32 bits of evoutbus to the evaluation module unit.

A data rate converter 600 shown in FIG. 6 comprises a plurality I/F Blocks 610 comprising a plurality of registers 601, plurality of parity checkers 615 each attached to an asynchronous fifo memory 620, and all attached to an aggregator 630 wherein 256 pins read double data rate input to the chip using the board clock and 512 bits of data are placed on the internal bus 632 written by the core internal clock 621 said data rate converter optimizing the use of pins on the micro octal simulation accelerator integrated circuit. The aggregator unit waits for all the fifos to have data, then reads a word form each fifo to form the 512 bit bus.

A trace functional unit (TFU) 700 shown in FIG. 7A comprises a mask memory 710, a previous state memory 720, and trace logic 730 attached to a plurality of external trace buffer memories 740 and by a signal TB_HIT 732 to the trace consolidation unit (TCU) 440 of the evaluation module board 400. In an embodiment each unit may have a Trace Consolidation Unit (TCU) 440 which deals with the 16 TB_HIT event bits (one from each octal chip). A TCU may have 16 inputs (one from each TFU) and 2 event trace memories (256K×32).

The trace buffer memories are treated as a double buffer, wherein only one of the two trace buffer memories is active at any time. When that one becomes full the second one becomes active and the first one is drained by the software.

When a valid cycle is executed for cluster C, the TCU looks at the TB_HIT event bits. If any T_HIT event bit is asserted, then an event has occurred and the TCU pushes a value into the event trace memory. The value pushed consists of the 16 bits of TB_HIT event data (in the lower 16 bits) and the cluster number (C) in the upper 16 bits (though only 12 of those bits are valid) in an embodiment.

When each TCU receives a "time advance" signal the TCU writes a "time mark" value into the event trace memory. In an embodiment this "time mark" has the value 0xf0000000. These time marks in the trace buffer data stream denote time boundaries in the data stream.

The key differences between trace in the present invention from conventional simulation accelerators is the addition of the TCU which unifies the cluster information in a separate buffer. This provides some compression over the old model in most real cases. Take for example a case where there were 1 event on each octal. With the old model (extended for the wider data) we would have stored 16 bits of cluster and 32 bits of data per octal for a total of 768 bits. With the new model we would store 32 data bits per octal plus 32 bits of cluster/event data in the TCU for a total of 544 bits. This is about a 30% saving.

In an embodiment each octal chip in a unit may have a trace functional unit (TFU) which deals with the 32 bits of output from that octal. Said trace functional unit may consist of a previous state memory (4K×32), a mask memory (4 k×32) and two trace buffer memories (256K×32). Thus for each cluster there may be a corresponding previous state and mask memory entry.

Figure 9:
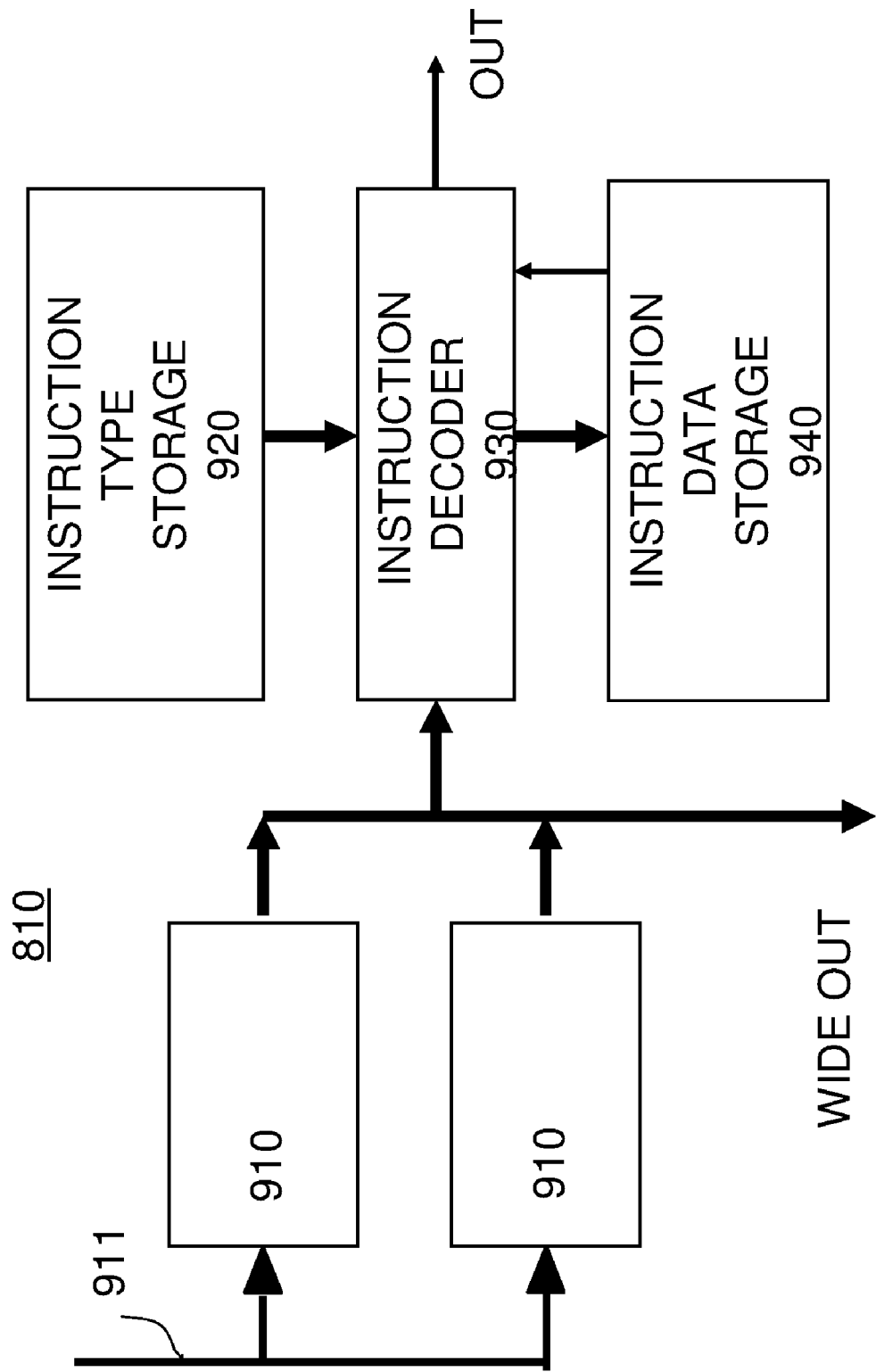
FIG. 9 is a block diagram of an evaluation processor

An evaluation processor, in an embodiment a combinational logic operation evaluation block 810, detailed in FIG. 9, comprises a plurality of circuit signal memories 910 reading data from the evinbus 911, an instruction type storage 920 controlling an instruction decoder 930, which applies addresses to and retrieves evaluation results from an instruction data storage device 940. In an embodiment, each combination logic operation evaluation block may select 16 of 512 bits of evaluation input and may emit 4 bits of evaluation output. For wide functions, all 16 selected bits may be passed through to the wide function evaluator.

Figure 10:
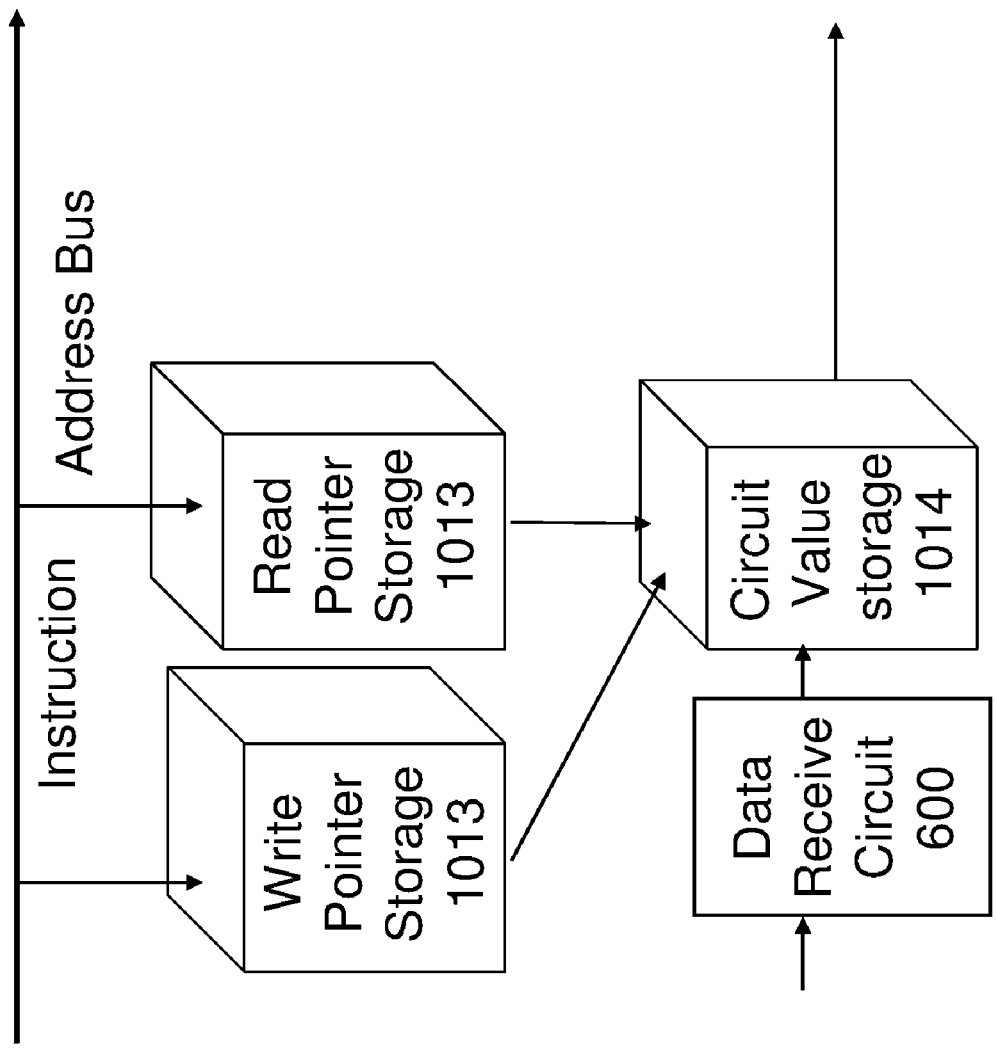
FIG. 10 is a block diagram of the memory of an evaluation processor

A circuit signal memory 910 is detailed in FIG. 10 comprising a plurality of dual port circuit value storage memories 1014 controlled by read pointer storage memories 1013 and write pointer storage memories 1013. In an embodiment two bits of circuit value information are retrieved from the dual channel circuit signal value memory to form part of the address applied to the instruction data storage eliciting the combinational logic evaluation. Previous results of logic evaluation or data from primary inputs may be selected and stored in the dual channel circuit value storage memory for later retrieval and use in evaluations scheduled by the compiler.

Critical Path Reducer

The present invention further comprises a method of selecting and reassigning nodes or nets within the critical path of a design to efficiently assign physical resources and communication bandwidth.

The method of critical path merging comprising the steps of

1. For each node v, computing the length of longest path from v. (Since the netlist is a DAG, the longest path exists and is finite.) Call this value the back rank of v.

2. Computing the length of longest path in the circuit. This times the intraboard delay is a lower bound on time to evaluate the domain. This value is the goal path length.

3. For each node v working from inputs to outputs, computing a rank as follows:

computing the maximum rank of the node that drive its inputs, adding either the intraunit or the interunit delay pseudorandomly, wherein, the rank of v is an estimate of how soon v can be evaluated and the compiler also knows the length of the longest path starting at v, whether v is on a path that is close to critical (The probability that the compiler chooses the intraboard delay is a function of how critical the most critical path containing v appears to be. If v is on long paths it chooses the intraboard delay with high probability. If v is only on short paths, the compiler chooses the intraboard delay only with low probability.), computing the minimum path length of v as the maximum driver rank of v plus the back rank of v times the intraunit delay, computing the maximum path length of v as the maximum driver rank of v plus the back rank of v times the interunit delay, if the minimum path length is greater than or equal to the goal length, using the intraunit delay, but if the maximum path length is at most the goal length, using the interunit delay, otherwise, using the interunit delay the closer the goal length is to the maximum path length.

4. For every pair of nodes u and v such that u drives v, merging u and v if ranks of u and v as computed in step 3 above differ by at least the interunit delay.

Although particular embodiments of the present invention have been shown and described, it will be obvious to those skilled in the art that changes and modifications may be made without departing from the present invention in its broader aspects, and therefore, the appended claims are to encompass within their scope all such changes and modifications that fall within the true scope of the present invention.

CONCLUSION

The present invention addresses the issue of scalability of emulation and simulation of electronic circuits in the design of more complex products in a timely manner. A great deal of parallelism is achieved by having an array of circuit evaluation processors attached to a plurality of canvassing processors which ensure the transfer of circuit signal values to those evaluation processors requiring the result of a previous evaluation. This is achieved by scheduling the evaluation instructions and inserting canvassing instructions to transfer the evaluation results.

The present invention provides means for electronics design engineers to verify, test, and analyze nanometer scaled integrated circuits and complex systems by executing instructions compiled from a hardware description language functional model of the hypothetical system prior to fabrication.

What is claimed is:

1. A method for verifying electronic circuit designs in anticipation of fabrication by simulation and emulation using a system comprising a host computer, a first evaluation unit and a second evaluation unit, each evaluation unit comprising:

a plurality of evaluation processors, a single canvassing processor, one or more circuit signal value transfer circuits, one or more circuit signal value reading circuits, means for transferring circuit signal values among processors and means to transfer deterministically scheduled circuit signal values sent by a transfer circuit in the first evaluation unit to a reading circuit in the second evaluation unit;

the method comprising:

analyzing, using the host computer, a circuit description for inherent circuit signal value transfer activity among its elements, translating, using the host computer, the circuit description to evaluation processor instructions, assigning, using the host computer, the evaluation processor instructions to certain evaluation processors to optimize circuit signal value transfers, composing, using the host computer, canvassing processor instructions to ensure that results from certain evaluation processors are transferred to certain other evaluation processors according to the circuit description, scheduling, using the host computer, execution of evaluation processor instructions and canvassing processor instructions to avoid deadlock, and executing, using the evaluation units, the scheduled evaluation processor instructions and the scheduled canvassing processor instructions until all scheduled instructions are executed.

2. The method of claim 1 further comprising blocking execution of an evaluation processor instruction until all data required for the instruction is available to the evaluation processor, using a data checking circuit in the evaluation processor.

3. The method of claim 1 further comprising delaying execution of said canvassing processor instructions to ensure avoidance of overflow of a circuit signal value storage unit associated with the reading circuit by suspending transfer of circuit signal values until the circuit signal value storage unit has available storage capacity.

4. The method of claim 1 further comprising transferring certain evaluation processor results to the host computer through a host control interface coupled to a trace consolidation unit (TCU) of an evaluation unit, wherein each trace consolidation unit is coupled to a plurality of trace functional units (TFU), each TFU being associated with an evaluation processor, each TFU comprised of a mask memory, a previous state memory, and trace logic, said trace logic further coupled to a plurality of external trace buffer memories.

5. A system for verifying electronic circuit designs in anticipation of fabrication by simulation and emulation comprising:
a host computer;
a plurality of evaluation units;
each evaluation unit comprising:
a plurality of evaluation processors;
at least one canvassing processor;
one or more circuit signal value transfer circuits;
one or more circuit signal value reading circuits;
means for transferring circuit signal values among processors;
means to transfer deterministically scheduled circuit signal values sent by a transfer circuit in a first evaluation unit to a reading circuit in a second evaluation unit; and
a masked trace means comprising at least one trace consolidation unit (TCU) of the evaluation unit coupled to a plurality of trace functional units (TFU), each TFU being associated with an evaluation processor, each TFU comprised of a mask memory, a previous state memory, and trace logic, said trace logic further coupled to a plurality of external trace buffer memories;
wherein:
said evaluation processors within an evaluation unit are directly coupled to other evaluation processors within the same evaluation unit;
evaluation processors in different evaluation units are scalably coupled by means of the canvassing processors and a communication medium;
each evaluation processor is coupled through its trace functional unit and trace consolidation unit of the evaluation unit to a host control interface;
the TCU unifies trace information from a plurality of evaluation processors in a separate buffer;
said external trace buffer memories are paired as a double buffer whereby only one of the two trace buffer memories is active until it becomes fall whereupon the second trace buffer memory becomes active and the first trace buffer memory is drained; and
uploading trace data continues in parallel or simultaneously with continuous uninterrupted operation of the evaluation processors of the system.

6. A method for scalably emulating an electronic circuit description, using a system comprising a host computer, a first evaluation unit and a second evaluation unit, each evaluation unit comprising:
a plurality of evaluation processors, a single canvassing processor, one or more circuit signal value transfer circuits, one or more circuit signal value reading circuits, means for transferring circuit signal values among processors, means to transfer deterministically scheduled circuit signal values sent by a transfer circuit in the first evaluation unit to a reading circuit in the second evaluation unit; and a masked trace means comprising at least one trace consolidation unit (TCU) of the evaluation unit coupled to a plurality of trace functional units (TFU), each TFU being associated with an evaluation processor;
wherein:
said evaluation processors within an evaluation unit are directly coupled to other evaluation processors within the same evaluation unit;
evaluation processors in different evaluation units are scalably coupled by means of the canvassing processors and a communication medium;
the method comprising:
executing program instructions on a plurality of evaluation processors and on a single canvassing processor connecting a first evaluation unit to a second evaluation unit resulting in a transfer of results of selected evaluation processor evaluations to other selected evaluation processors to perform further evaluations; and
updating one or more circuit signal values, wherein updating comprises:
transferring a circuit signal value,
reading the circuit signal value, and
storing the circuit signal value data in a circuit signal value storage,
within one or more trace functional units:
examining a mask memory to determine if a circuit signal within the trace functional unit is being traced,
examining a previous state memory to determine if the circuit signal has changed value,
recording a new circuit signal value into an external trace buffer, and
sending an event signal to a trace consolidation unit to signal an event,
within the trace consolidation unit:
writing a time mark value into trace event memory when a time advance signal is received,
writing a cluster number into the trace event memory when an event has been signaled, wherein the cluster number is an identification number for a plurality of evaluation processors coupled to a specific canvassing processor within an evaluation unit, and
writing one or more signals into the trace event memory to indicate which trace functional units have signaled the event and recorded a new value of the circuit signal being traced.

7. The method of claim 6 further comprising:
suspending execution of an evaluation instruction until data is available, wherein suspending comprises:
checking a circuit signal value storage for availability of all data necessary for executing an evaluation instruction; and
enabling execution of an evaluation instruction only when all data necessary for executing the evaluation instruction is available;
controlling transfer of circuit signal values, wherein controlling comprises:
composing canvassing instructions to pass results of a selected evaluation processor to those evaluation processors which require those results to execute their evaluation instructions; and blocking execution of a canvassing instructions, wherein blocking comprises:

checking a reading circuit signal value storage for unoccupied storage resource; and enabling execution of a canvassing instruction only when the reading circuit has unoccupied storage resource.

8. The method of claim 6 further comprising:

translating the electronic circuit description into executable evaluation processor instructions, and analyzing the circuit signal value transfers inherent to the electronic circuit description.

9. The method of claim 8 further comprising:

scheduling the execution of evaluation processor instructions in a plurality of evaluation processors, wherein scheduling comprises assigning evaluation processor instructions among evaluation processors to optimize circuit signal value transfers inherent in the electronic circuit design; and loading the evaluation instruction storage so that a first evaluation processor instruction is executed after one or more evaluation processor instructions on which the first evaluation processor instruction depends for circuit signal value input are executed.

10. An apparatus for improved tracing by reducing resources necessary for circuit signal value storage and transfer, the apparatus comprising:

a plurality of trace functional units, the trace functional unit comprising:

a mask memory to indicate if a circuit signal within the trace functional unit is being traced;

a previous state memory, and trace logic coupled to a plurality of external trace buffer memories and coupled by a signal to a trace consolidation unit, the trace consolidation unit having one or more trace event memories, wherein said external trace buffer memories are paired as a double buffer whereby only one of the two trace buffer memories is active until it becomes full whereupon the second trace buffer memory becomes active and the first trace buffer memory is drained, whereby uploading trace data continues in parallel or simultaneously with continuous uninterrupted operation of a plurality of evaluation processors of the apparatus.

11. A method for reducing resources necessary for circuit signal value storage and transfer comprising the steps:

within one or more trace functional units:

examining a mask memory to determine if a signal within the trace functional unit is being traced, examining a previous state memory to determine if a signal has changed value, recording a new value into an external trace buffer, and sending a signal to a trace consolidation unit to signal an event, within the trace consolidation unit:

writing a time mark value into trace event memory when a time advance signal is received, writing a cluster number into the trace event memory when an event has been signaled, wherein the cluster number is an identification number for a plurality of evaluation processors coupled to a specific canvassing processor within an evaluation unit, writing one or more signals into the trace event memory to indicate which trace functional units have signaled the event and recorded a new value of a signal being traced.

* * * * *